US009818629B2

(12) United States Patent
Shirakawa

(10) Patent No.: US 9,818,629 B2
(45) Date of Patent: Nov. 14, 2017

(54) SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventor: Makoto Shirakawa, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 560 days.

(21) Appl. No.: 14/173,979

(22) Filed: Feb. 6, 2014

(65) Prior Publication Data

US 2014/0222187 A1  Aug. 7, 2014

(30) Foreign Application Priority Data

Feb. 7, 2013 (JP) .................................. 2013022410

(51) Int. Cl.
    *H01L 21/67*      (2006.01)
    *G05B 19/042*    (2006.01)

(52) U.S. Cl.
CPC .... *H01L 21/67201* (2013.01); *G05B 19/0426* (2013.01); *G05B 2219/34365* (2013.01)

(58) Field of Classification Search
None
See application file for complete search history.

(56) References Cited

U.S. PATENT DOCUMENTS 6,069,096 A    5/2000    Nishihata et al.
6,535,779 B1 *  3/2003    Birang .................... H01L 22/26
                                        257/E21.528
(Continued)

FOREIGN PATENT DOCUMENTS

JP      1997129554 A    5/1997
JP      1998261554 A    9/1998
(Continued)

OTHER PUBLICATIONS

Office Action in Korean Patent Application No. 10-2014-0010192, dated May 8, 2015, 37 pages, with English translation.
(Continued)

*Primary Examiner* — Tuan Dao
(74) *Attorney, Agent, or Firm* — Edell, Shapiro & Finnan LLC

(57) ABSTRACT

Provided is a substrate processing apparatus capable of efficiently resuming processing of unprocessed substrates after an error occurs during processing of substrates. In the substrate processing apparatus that executes a recipe defining an order of processing substrates and manages process status of the substrates, the process status are changed to a processing state so as to execute the recipe, are changed to a paused state when unprocessed substrates are present among the substrates to be processed according to the recipe, due to an error occurring during the execution of the recipe, and are changed from the paused state to the processing state to resume the execution of the recipe so as to process the unprocessed substrates when the error is canceled and a operation is performed to resume the execution of the recipe.

11 Claims, 11 Drawing Sheets

(56) References Cited

U.S. PATENT DOCUMENTS

| | | | |
|---|---|---|---|
| 2006/0215338 A1* | 9/2006 | Yokouchi | H01L 21/67253 361/56 |
| 2008/0071403 A1* | 3/2008 | Conway | C30B 13/24 700/97 |
| 2009/0114346 A1* | 5/2009 | Yashima | G05B 19/4184 156/345.24 |

FOREIGN PATENT DOCUMENTS

| | | |
|---|---|---|
| JP | 2006203145 | 8/2006 |
| JP | 4252169 | 4/2009 |
| JP | 4664868 | 4/2011 |
| JP | 2012-049429 A | 3/2012 |

OTHER PUBLICATIONS

Office Action in corresponding Japanese Application No. 2013-022410, dated Jan. 24, 2017, with English Translation.

* cited by examiner

SUBSTRATE PROCESSING APPARATUS AND NON-TRANSITORY COMPUTER-READABLE RECORDING MEDIUM

CROSS REFERENCE TO RELATED APPLICATION

This application claims foreign priority under 35 U.S.C. §119(a)-(d) to Application No. JP 2013-022410 filed on Feb. 7, 2013, entitled "Substrate Processing Apparatus and Non-Transitory Computer-Readable Recording Medium," the entire contents of which are hereby incorporated by reference.

FIELD OF THE INVENTION

The present invention relates to a substrate processing apparatus and a non-transitory computer-readable recording medium.

BACKGROUND OF THE INVENTION

Methods of continuously performing substrate processing as long as possible without stopping a device have recently been performed. For example, Japanese Patent Application Publication No. 4664868 discloses a degeneracy operation to continuously perform substrate processing in another normal chamber when an error occurs in a chamber in which the substrate processing is being performed. Also, even if a device is stopped due to the error, the substrate processing is performed as long as possible by fixing the error, performing the substrate processing, and reprocessing unprocessed substrates. For example, Japanese Patent Application Publication No. 4252169 discloses reprocessing unprocessed substrates after substrates are collected.

SUMMARY

Conventionally, when an error occurs during processing of substrates (wafers), a substrate storage container (carrier) associated with the processing is abnormally shut down, and should be unloaded from an apparatus and loaded again into the apparatus to resume the processing of unprocessed substrates (wafers). In this case, it is difficult to manage, for example, data regarding even substrates in the same lot between before the error occurs and when these substrates are reprocessed.

It is an object of the present invention to provide a method of manufacturing a semiconductor device and a substrate processing apparatus which are capable of efficiently resuming processing of unprocessed substrates after an error occurs during processing of substrates.

According to one aspect of the present invention, there is provided a substrate processing apparatus including: a control unit configured to control an execution of a recipe defining an order of processing a substrate and manage a process status of the substrate; and a manipulation unit configured to receive a resume command instructing to resume a stopped operation, wherein the control unit changes the process status to a processing state so as to control an execution of the recipe, and changes the process status to a pause state when an unprocessed substrate is present among substrates to be processed according to the recipe when the execution of the recipe is stopped due to an error occurring during the execution of the recipe, wherein the manipulation unit transmits the resume command to the control unit when the resume command is received after the error is canceled and an operation for resuming the execution of the recipe is performed, and wherein the control unit changes the process status from the pause state to the processing state, and resumes the execution of the recipe so as to process the unprocessed substrate when receiving the resume command.

According to another aspect of the present invention, there is provided a non-transitory computer-readable recording medium storing a program for causing a computer of a substrate processing apparatus to perform a control sequence for controlling an execution of a recipe defining an order of processing a substrate and managing a process status of the substrate, the control sequence including: (a) changing the process status to a processing state so as to perform a process according to the recipe; (b) changing the process status to an aborted state in case an unprocessed substrate is not present among substrates to be processed according to the recipe when the process according to the recipe is stopped due to an error occurring during the execution of the recipe; and (c) changing the process status to a paused state in case the unprocessed substrate is present among the substrates to be processed according to the recipe when the process according to the recipe is stopped due to the error occurring during the execution of the recipe.

According to still another aspect of the present invention, there is provided a substrate processing apparatus including: a control unit configured to control an execution of a recipe defining an order of processing a substrate and manage a status of a substrate processing apparatus; and a manipulation unit configured to receive a command, wherein the control unit changes the status of the substrate processing apparatus from a processing state to an abnormal termination state when an error occurs during the execution of the recipe, wherein the manipulation unit transmits an instruction to change the status of the substrate processing apparatus to the control unit when receiving a predetermined command, and wherein the control unit changes the status of the substrate processing apparatus from the abnormal termination state to an idle state when receiving the command from the manipulation unit, and changes the status of the substrate processing apparatus from the idle state to a standby state and then to the processing state so as to resume the execution of the recipe when the error is fixed and a recovery operation for resuming the execution of the recipe is performed.

According to yet another aspect of the present invention, there is provided a non-transitory computer-readable medium storing a control program for causing a computer of a substrate processing apparatus to control an execution of a recipe defining an order of processing a substrate and manage a status of the substrate processing apparatus, the control program including: (a) changing the status of the substrate processing apparatus from a processing state to an abnormal termination state when an error occurs during the execution of the recipe; (b) changing the status of the substrate processing apparatus from the abnormal termination state to an idle state when a predetermined command is received; and (c) changing the status of the substrate processing apparatus from the idle state to a standby state and then to the processing state so as to resume the execution of the recipe when the error is fixed and a recovery operation for resuming the execution of the recipe is performed.

According to the present invention, processing of unprocessed substrates can be efficiently resumed after an error occurs during processing of substrates.

DETAILED DESCRIPTION

One Embodiment of the Present Invention

Hereinafter, the structure and operation of a substrate processing apparatus according to an embodiment of the present invention will be described.

(1) The Structure of a Substrate Processing Apparatus

Figure 1:
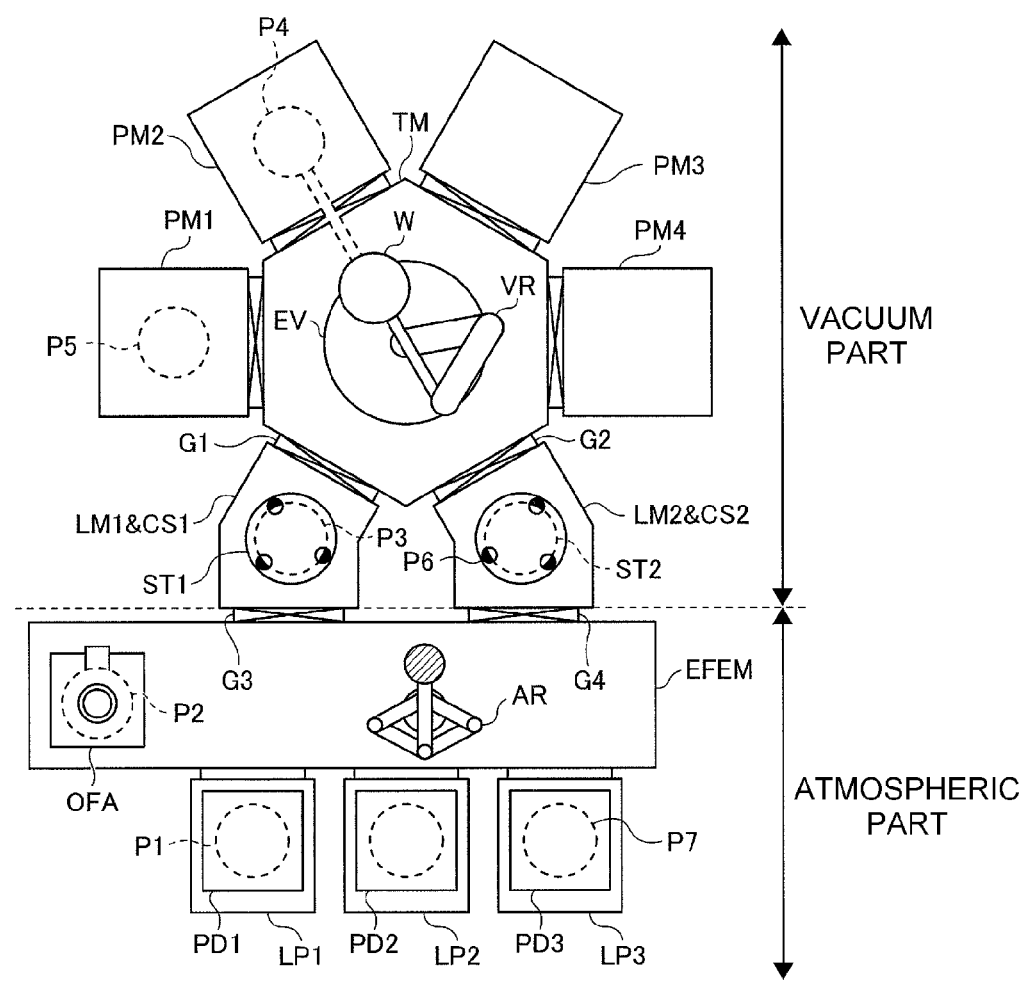
FIG. 1 is a schematic configuration diagram of a cluster type substrate processing apparatus according to an embodiment of the present invention.
Figure 2:
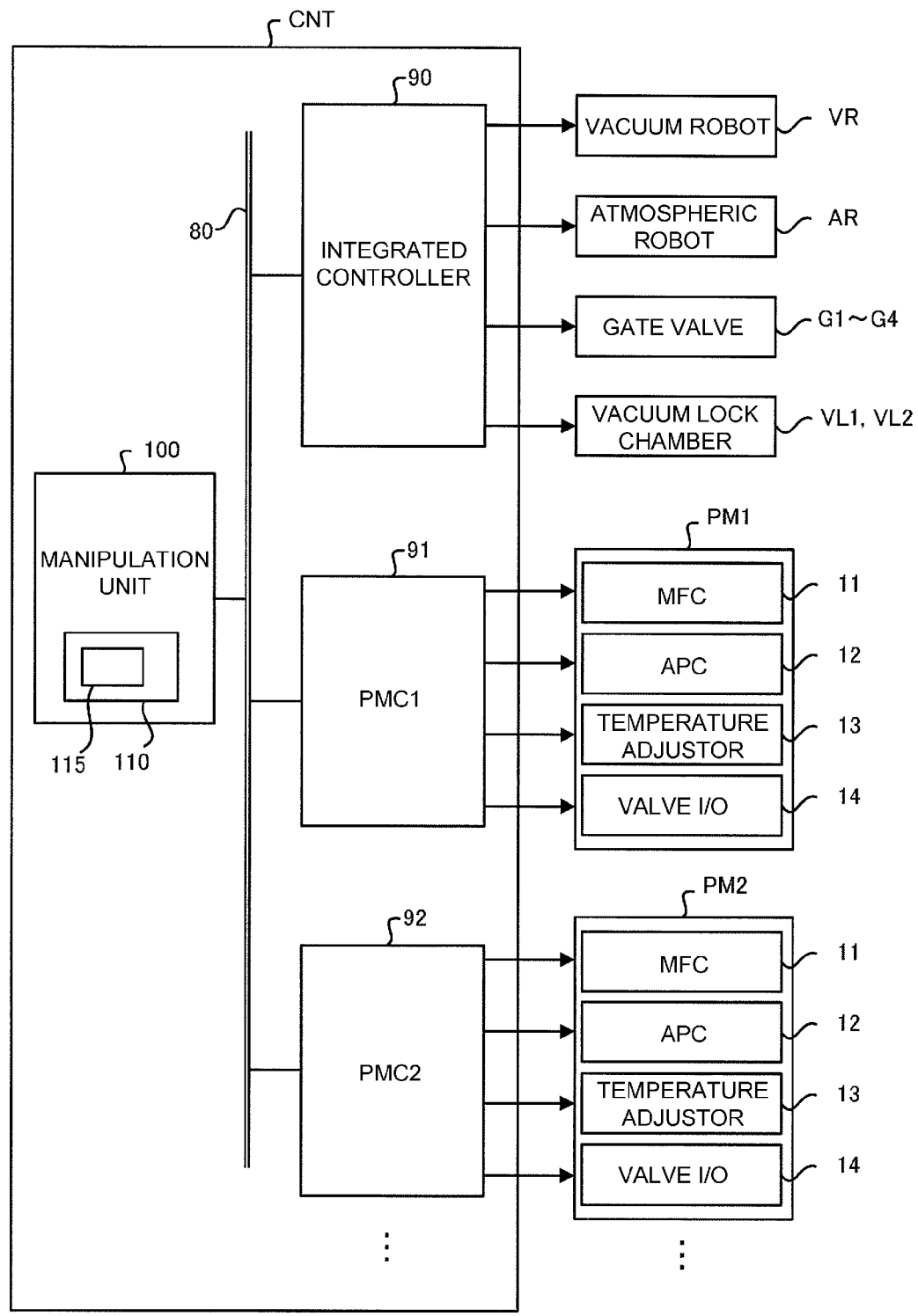
FIG. 2 is a block diagram of a control unit of a substrate processing apparatus according to an embodiment of the present invention.

First, the structure of a substrate processing apparatus will be described with reference to FIGS. 1 and 2 below. FIG. 1 is a schematic configuration diagram of a cluster type substrate processing apparatus according to an embodiment of the present invention. FIG. 2 is a block diagram of a control unit CNT of a substrate processing apparatus according to an embodiment of the present invention. The cluster type substrate processing apparatus according to the present embodiment is divided into a vacuum part and an atmospheric part.

Structure of the Vacuum Part

In the vacuum part of the cluster type substrate processing apparatus, a vacuum transfer chamber (transfer chamber) TM that may be vacuum-sealed, load module chambers (load lock chambers) LM1 and LM2 serving as spare chambers, and process chambers PM1, PM2, PM3, and PM4 serving as process furnaces each including a process chamber for processing wafers W which are substrates are installed. The load module chambers LM1 and LM2 and the process chambers PM1, PM2, PM3, and PM4 are arranged along an outer circumference of the vacuum transfer chamber TM in the form of a star (the form of a cluster).

The vacuum transfer chamber TM is configured to have a load lock chamber structure that can withstand a pressure (negative pressure) that is lower than atmospheric pressure e.g., a vacuum state. In one embodiment of the present invention, a housing of the vacuum transfer chamber TM has a hexagonal shape in a plan view and is formed in a box shape, the upper and lower ends of which are closed.

In the vacuum transfer chamber TM, a vacuum robot VR serving as a vacuum transfer mechanism is installed. The vacuum robot VR transfers the wafer W between the load module chambers LM1 and LM2 and the process chambers PM1, PM2, PM3, and PM4 by placing the wafer W on an arm which is a substrate placing unit. Also, the vacuum robot VR is configured to be moved upward/downward via an elevator EV while maintaining the airtight property of the vacuum transfer chamber TM. Wafer presence sensors (not shown) serving as substrate detection units that detect whether the wafer W is present are installed on a predetermined location (near a gate valve) ahead of the load module chambers LM1 and LM2 and the process chambers PM1, PM2, PM3, and PM4.

The process chambers PM1, PM2, PM3, and PM4 are configured to add an added value to the wafer W by performing a process of forming a thin film on the wafer W, a process of forming an oxide film or a nitride film on a surface of the wafer W, or a process of forming a metal thin film on the wafer W. In each of the process chambers PM1, PM2, PM3, and PM4, not only a gas introduction/exhaust mechanism (not shown), and a plasma discharge mechanism (not shown) but also a mass flow controller (MFC) 11 configured to control the flow rate of a process gas to be supplied into the process chamber, an auto pressure controller (APC) 12 configured to control pressure in the process chamber, a temperature adjustor 13 configured to control temperature in the process chamber, and an input/output valve I/O 14 configured to control the supply of a process gas or control an exhaust valve to be "on"/"off" illustrated in FIG. 2 are installed. A surface of the wafer W is processed by generating plasma in the process chambers PM1 to PM4 by supplying high-frequency power to the plasma discharge mechanism while supplying a process gas into the process chambers PM1 to PM4 using the gas introduction mechanism while the insides of the process chambers PM1, PM2, PM3, and PM4 (the insides of the process chambers) are exhausted using the gas exhaust mechanism.

The load module chambers LM1 and LM2 function as spare chambers for loading the wafer W into the vacuum transfer chamber TM or as spare chambers for unloading the wafer W from the vacuum transfer chamber TM. In the load module chambers LM1 and LM2, buffer stages ST1 and ST2 serving as stages for loading/unloading a substrate are installed to temporarily support the wafer W. The buffer stages ST1 and ST2 also function as cooling stages CS1 and CS2, respectively.

The load module chambers LM1 and LM2 are configured to communicate with the vacuum transfer chamber TM via gate valves G1 and G2, respectively, and to communicate with an atmospheric transfer chamber (EFEM), which will be described below, via gate valves G3 and G4, respectively. Thus, the wafer W may be transferred between the load module chambers LM1 and LM2 and the atmospheric transfer chamber EFEM while the inside of the vacuum transfer chamber TM is maintained in a vacuum-airtight state by opening the gate valves G3 and G4 while the gate valves G1 and G2 are closed.

Also, the load module chambers LM1 and LM2 may be configured to have a load lock chamber structure that can withstand a negative pressure that is less than atmospheric pressure, such as a vacuum state, and the insides of the load module chambers LM1 and LM2 may be vacuum-exhausted. Thus, the wafer W may be transferred between the load module chambers LM1 and LM2 and the vacuum transfer chamber TM while the inside of the vacuum transfer chamber TM is maintained in a vacuum state by opening the gate valves G3 and G4 after the insides of the load module chambers LM1 and LM2 are vacuum-exhausted by closing the gate valves G3 and G4.

Structure of the Atmospheric Part

In the atmospheric part of the cluster type substrate processing apparatus, the atmospheric transfer chamber EFEM which is an atmospheric transfer chamber connected to the load module chambers LM1 and LM2, and load ports LP1 to LP3 which are substrate accommodation units connected to the atmospheric transfer chamber EFEM are installed. Pods PD1 to PD3 are placed as substrate storage containers (carriers) on the load ports LP1 to LP3, respectively. In the pods PD1 to PD3, a plurality of slots are formed as storage units for storing the wafer W.

In the atmospheric transfer chamber EFEM, a clean air unit (not shown) is installed to supply clean air into the atmospheric transfer chamber EFEM.

In the atmospheric transfer chamber EFEM, an atmospheric robot AR is installed as an atmospheric transfer mechanism. The atmospheric robot AR is configured to transfer the wafer W which is a substrate between the load module chambers LM1 and LM2 and the pods PD1 to PD3 placed on the load ports LP1 to LP3. The atmospheric robot AR includes an arm which is a substrate placing unit, similar to the vacuum robot VR. Similarly, wafer presence sensors (not shown) serving as substrate detection units for detecting whether the wafer W is present are installed on a predetermined location ahead (near a gate valve) of the atmospheric transfer chamber EFEM.

Also, in the atmospheric transfer chamber EFEM, an orientation flat adjustment device OFA is installed as a substrate location adjustment device to adjust the location of the crystal orientation of the wafer W.

Structure of the Control Unit

The constitutional elements of the cluster type substrate processing apparatus are controlled by the control unit CNT. FIG. 2 illustrates an example of the structure of the control unit CNT. The control unit CNT includes an integrated controller (CC) 90 as an integrated controller, a process module controller PMC1 91 as a process furnace control unit, a process module controller PMC2 92 as another process furnace control unit, and a manipulation unit (OU) 100 configured to receive a command through a manipulation of an operator.

The process module controllers PMC1 91 and PMC2 92 are connected to the process chambers PM1 and PM2 to individually control operations of the process chambers PM1 and PM2, respectively. In detail, the process module controller 91 is connected to the MFC 11, the APC 12, the temperature adjustor 13, and the input/output valve I/O 14 included in the process chamber PM1, and the process module controller 92 is connected to the MFC 11, the APC 12, the temperature adjustor 13, and the input/output valve I/O 14 included in the process chamber PM2. The process module controllers 91 and 92 are configured to control the operations of a mechanism of introducing a gas into/exhausting a gas from the process chambers PM1 and PM2, a temperature control and plasma discharge mechanism, cooling mechanisms of the cooling chambers CS1 and CS2, etc. Although FIG. 2 illustrates a case in which two process module controllers PMC1 and PMC2 and two process chambers PM1 and PM2 are used, the present invention is not limited thereto.

The integrated controller (CC) 90 is connected to the process module controllers 91 and 92 via a local area network (LAN) line 80, and configured to synthetically control the operations of the process chambers PM1 and PM2 via the process module controllers 91 and 92. The integrated controller 90 is connected to the vacuum robot VR, the atmospheric robot AR, the gate valves G1 to G4, and the load module chambers LM1 and LM2. Also, the integrated controller 90 is configured to control the operations of the vacuum robot VR and the atmospheric robot AR, opening and closing of the gate valves G1 to G4, and exhausting of the insides of the load module chambers LM1 and LM2. Also, the integrated controller 90 is connected to the wafer presence sensors described above, and is configured to produce and frequently update location information regarding the location of the wafer W in the substrate processing apparatus based on a detection signal received from the wafer presence sensors. Also, the integrated controller 90 is configured to control the operations of the vacuum robot VR and the atmospheric robot AR which are transfer devices and the gate valves G1 to G4, etc., based on various data, such as storage information designating a slot in the pods PD1 to PD3 in which the wafer W is to be stored, the location information, a process status related to the wafer W, wafer identification (ID) information identifying the wafer W, a recipe performed on the wafer W, etc.

The manipulation unit (OU) 100 is connected to the integrated controller 90 and the process module controllers 91 and 92 via the LAN line 80. The manipulation unit 100 is configured as a computer that includes a central processing unit (CPU), a read-only memory (ROM), a random-access memory (RAM), and a communication interface. The ROM is a recording medium such as an electrically erasable programmable ROM (EEPROM), a flash memory, a hard disk, etc., and may store a program for operating the CPU. The RAM may function as a work area of the CPU, etc. The CPU is a central part of the manipulation unit 100, runs control programs, such as an overall system control program stored in the ROM, a program for manipulating the process chamber PM1, a program for manipulating the process chamber PM2, etc., and executes a stored recipe (e.g., a process recipe) according to a command given from a manipulation panel.

The overall system control program is read out to a memory from a hard disk of the manipulation unit 100 and is run by the CPU to control the manipulation unit 100 to perform a function of transmitting an operation command (message) to the integrated controller 90 and receiving an operation report (message) from the integrated controller 90. The program for manipulating the process chamber PM1 and the program for manipulating the process chamber PM2 are read out to a memory from the hard disk of the manipulation unit 100 and are run by the CPU to control the manipulation unit 100 to perform a function of transmitting an operation command (message) to the process module controllers 91 and 92 and receiving an operation report (message) from the process module controllers 91 and 92 via the integrated controller 90.

A display device 110 is installed in the manipulation unit 100. Information regarding a control job, information regarding a process job, a status of a job, etc. (which will be described below) are displayed on a display unit 115 of the display device 110. Also, an input device (manipulation panel) functioning as a command receiver for receiving a command is installed in the manipulation unit 100.

(2) An Example of a Substrate Processing Process Performed by the Substrate Processing Apparatus According to the Current Embodiment Will be Described with Reference to FIGS. 3 and 4.

Figure 3:
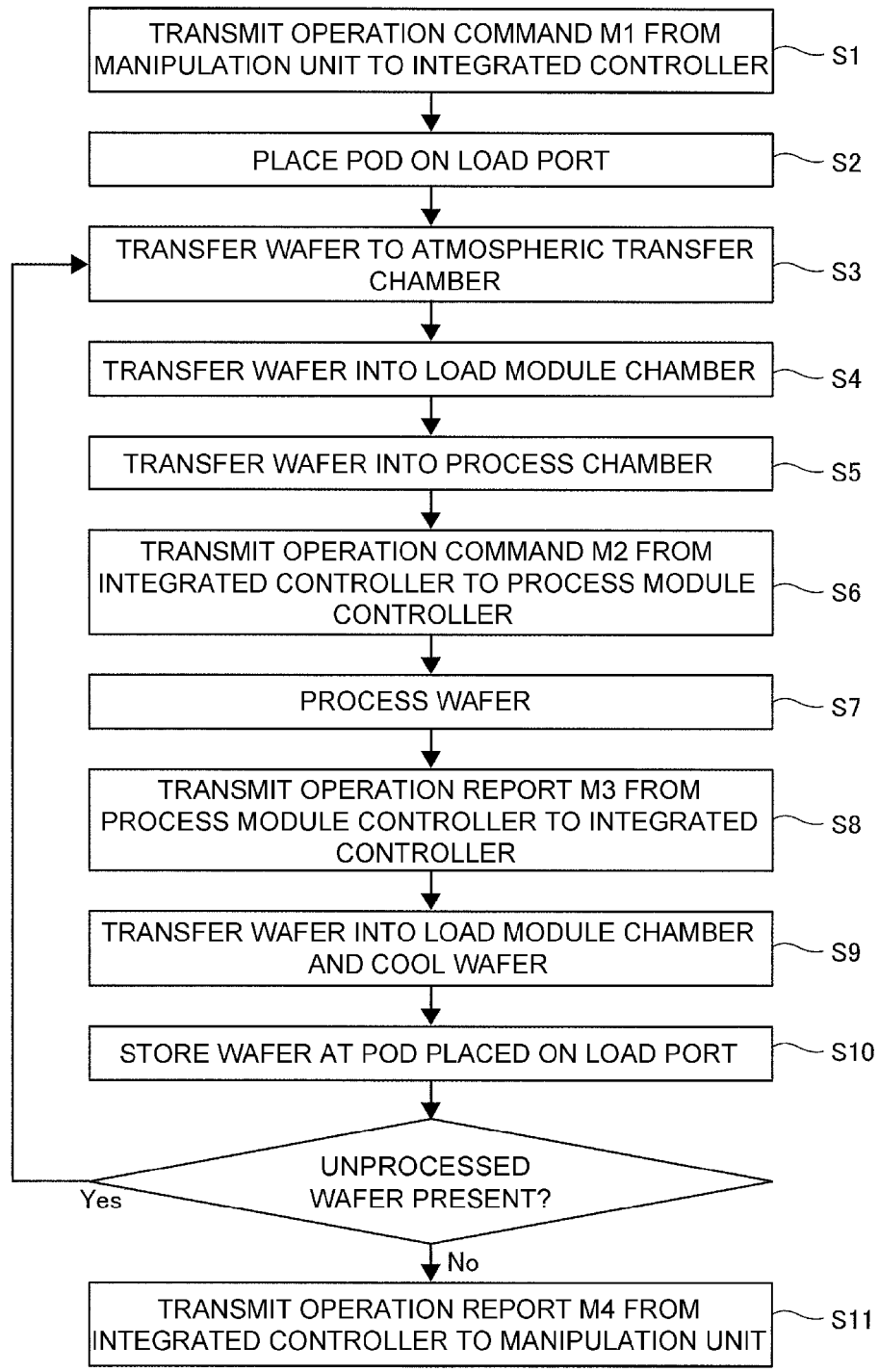
FIG. 3 is a flowchart of a substrate processing process performed by a substrate processing apparatus according to an embodiment of the present invention.
Figure 4:
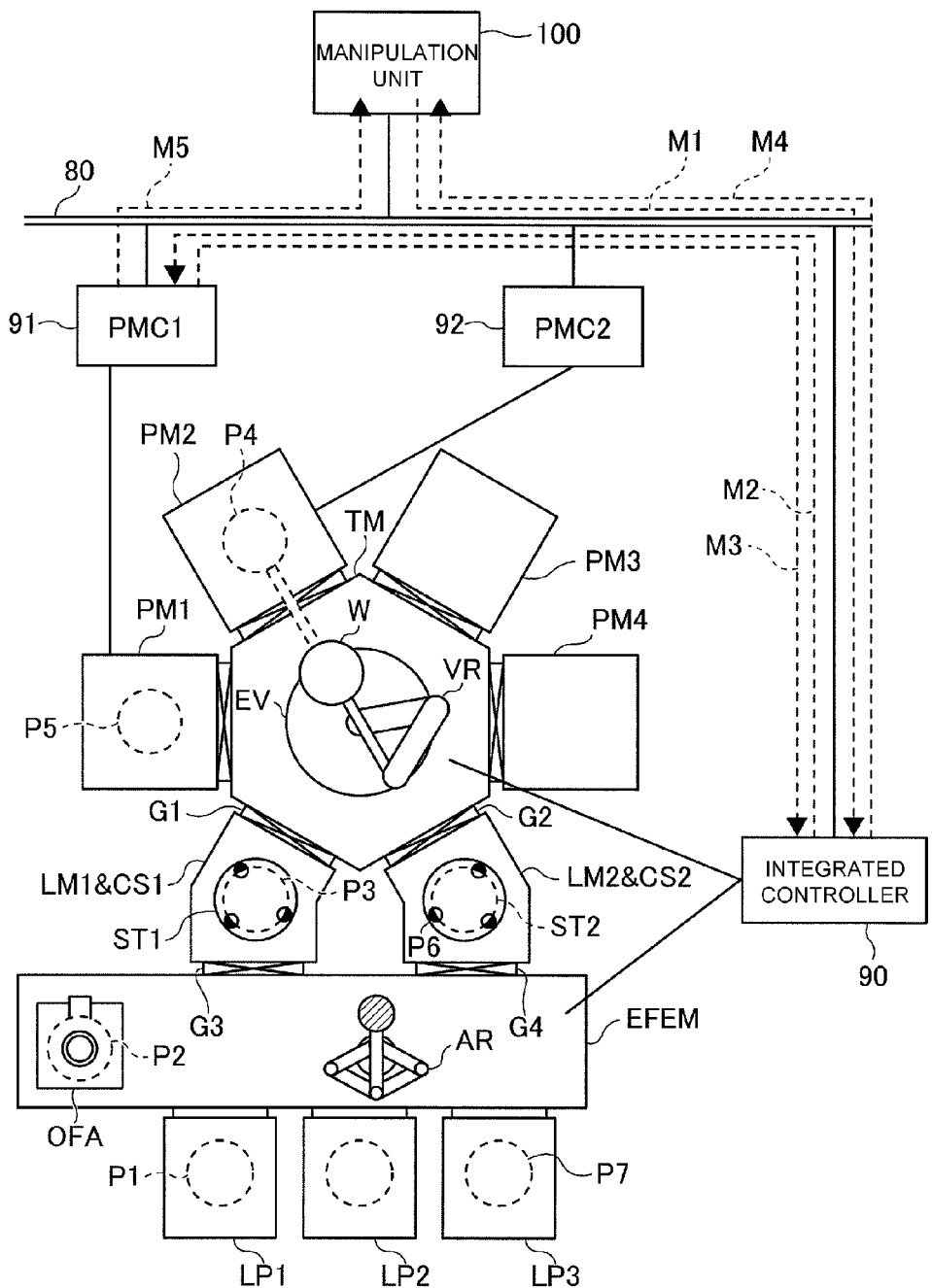
FIG. 4 is a diagram schematically illustrating an operation of a control unit in a substrate processing process according to an embodiment of the present invention.

FIG. 3 is a flowchart of a substrate processing process performed by a substrate processing apparatus according to an embodiment of the present invention. FIG. 4 is a diagram schematically illustrating an operation of a control unit in a substrate processing process according to an embodiment of the present invention. In FIG. 4, broken lines denote exchange of messages in the substrate processing apparatus.

As illustrated in FIG. 3, first, an operation command M1 instructing to start substrate processing is transmitted from the manipulation unit 100 to the integrated controller 90 via the LAN 80 (operation S1).

The integrated controller 90 that receives the operation command M1 closes the gate valves G1 and G4 and opens the gate valves G2 and G3 to vacuum-exhaust the insides of the vacuum transfer chamber TM and the process chambers PM1, PM2, PM3, and PM4. Then, the integrated controller 90 supplies clean air into the atmospheric transfer chamber EFEM such that a pressure in the atmospheric transfer chamber EFEM becomes substantially the same as atmospheric pressure. Then, the pod PD1 that stores a plurality of unprocessed wafers W is placed on the load port LP1 by a transfer device (not shown) (operation S2).

Then, the integrated controller 90 transfers the wafer W stored at a substrate position P1 on the pod PD1 placed on the load port LP1 to the atmospheric transfer chamber EFEM using the atmospheric robot AR, installs the wafer W at a substrate position P2 on the orientation flat adjustment device OFA, and performs location adjustment of the crystal orientation of the wafer W (operation S3).

Then, the integrated controller 90 picks up the wafer W installed at the substrate position P2 using the atmospheric robot AR, transfers the wafer W into the load module chamber LM1, installs the wafer W at a substrate position P3 on the buffer stage ST1, and then closes the gate valve G3 to vacuum-exhaust the inside of the load module chamber LM1 (operation S4).

When the load module chamber LM1 is depressurized to a predetermined pressure level, the integrated controller 90 opens the gate valve G1 while the gate valve G3 is closed. Then, the integrated controller 90 picks up the wafer W installed at the substrate position P3 using the vacuum robot VR, transfers the wafer W into the process chamber PM1, and installs the wafer W at a substrate position P5 (operation S5).

When the wafer W is transferred into the process chamber PM1, the integrated controller 90 transmits an operation command M2 instructing to start execution of a substrate processing recipe to the process module controller 91 via the LAN 80 (operation S6).

The process module controller 91 supplies a process gas into the process chamber PM1, and performs predetermined processing (film forming processing, etc.) on the wafer W (operation S7).

When the processing of the wafer W is completed, the process module controller 91 transmits an operation report M3 indicating the completion of the processing of the wafer W to the integrated controller 90 via the LAN 80 (operation S8).

The integrated controller 90 that receives the operation report M3 picks up the processed wafer W installed at the substrate position P5 using the vacuum robot VR.

Then, the integrated controller 90 transfers the processed wafer W into the load module chamber LM2 and disposes the processed wafer W at a substrate position P6 on the buffer stage ST2. Then, the integrated controller 90 closes the gate valve G2, supplies clean air into the load module chamber LM2 to control the inside of the load module chamber LM2 to have pressure that is substantially the same as atmospheric pressure, and then opens the gate valve G4 (operation S9).

Then, the integrated controller 90 picks up the processed wafer W installed at the substrate position P6 using the atmospheric robot AR, and transfers the processed wafer W to the pod PD3 placed on the load port LP3 so that the processed wafer W may be stored in an unoccupied slot in the pod PD3 (operation S10).

Then, when all unprocessed wafers W are automatically transferred by repeatedly performing the process described above, the integrated controller 90 unloads the pod P3 storing the processed wafers W from the load port LP3. Then, the integrated controller 90 completes the substrate processing by transmitting an operation report M4 indicating the completion of the substrate processing instructed by an operator to the manipulation unit 100 via the LAN 80 (operation S11).

In operations S1 to S11 described above, monitor data or an alarm (message M5) transmitted from the process module controllers 91 and 92 is directly transmitted from the manipulation unit 100 without the integrated controller 90.

(3) A Control Job, a Process Job, and a Job Performed During Substrate Processing by a Substrate Processing Apparatus Will Now be Described. In a Substrate Processing Process, a Series of Substrate Processing is Performed by Performing the Control Job. The Control Job is Associated with at Least One Process Job.

Figure 5:
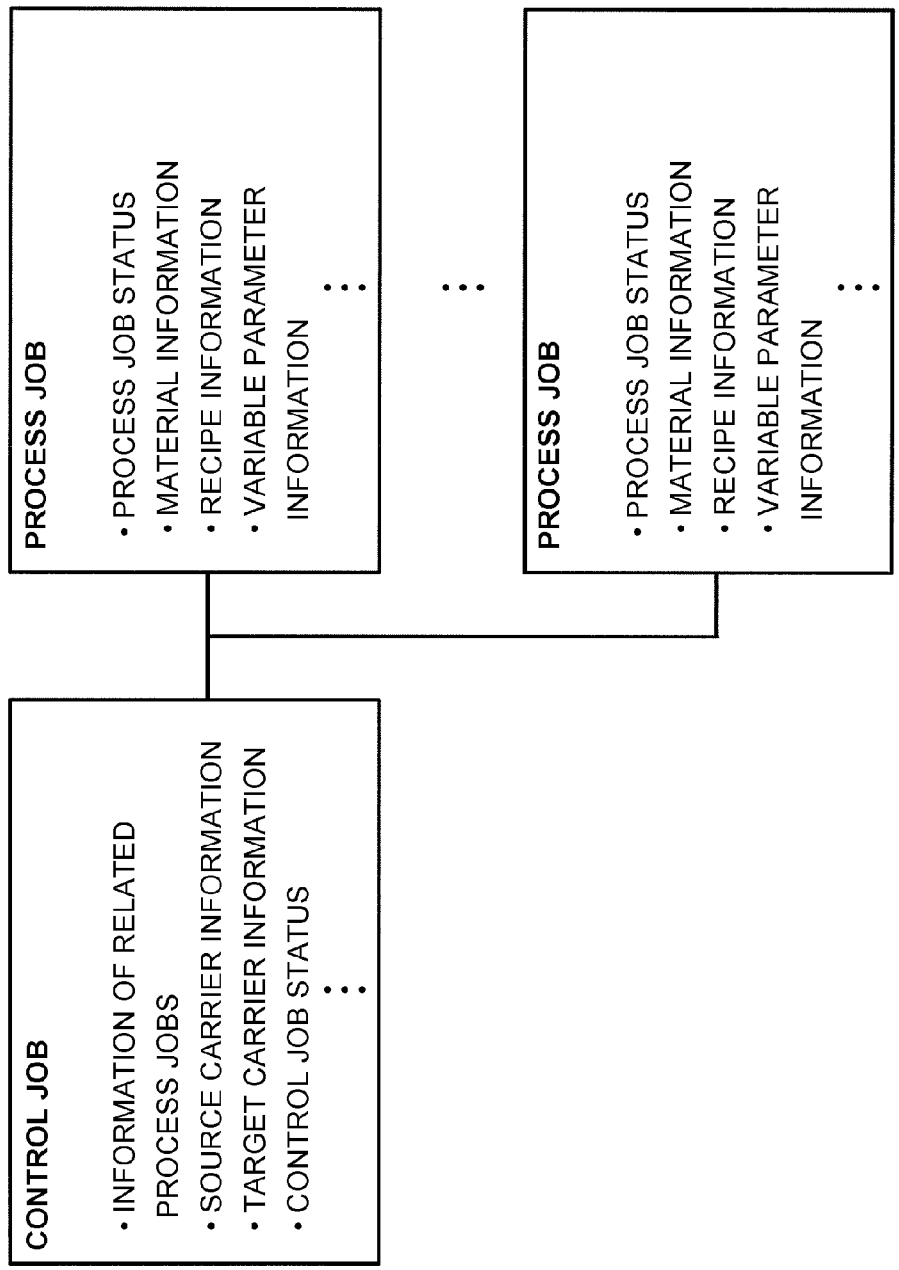
FIG. 5 is a diagram illustrating an example of information associated with a control job and a process job.

FIG. 5 is a diagram illustrating an example of information associated with a control job and a process job. The control job is information associated with at least one process job and used to synthetically control a series of substrate processing. Also, the control job is associated with information specifying a substrate storage container (carrier) such as a front opening unified pod (FOUP) in which a substrate that is to be processed is loaded (source carrier information), information specifying a substrate storage container in which a processed substrate is accommodated (target carrier information), information regarding a process status (state) regarding the control job, etc. Here, the process status of the control job is a variable representing an executive situation of the control job and indicates a process state of the control job. For example, a queue state, an execution state, a completion state, etc. are designated as status values, and the process status of the control job changes in relation to a process status of the process job which will be described below.

Also, the process job is a job generated for each process recipe (each substrate processing recipe) that is information defining an order of processing a substrate, and is information for controlling substrate processing. The process job is associated with a substrate to be processed (material usage information), recipe information to be used for the processing of the substrate, a process status (state) information of the process job, variable parameter information, etc. Here, the process status of the process job is a variable parameter representing an executive situation of the process job and represents a process state of the process job. The process status of the process job will be described in detail below.

Also, the substrate processing apparatus manages substrate processing states in units of substrate processing containers or in units of substrates. For example, the process statuses managed in units of substrate processing containers are associated with the control job, and the process statuses managed in units of substrates are associated with the process job. Also, the substrate processing apparatus manages a process status (state) thereof, and the process status (state) of the substrate processing apparatus is associated with a process status of at least one control job. Also, the process status of the substrate processing apparatus may be, for example, an idle state, a standby state, a ready state, a running (or run) state, an abnormal termination state, etc., and changes in relation to a change in the process status of the control job.

The substrate processing apparatus performs substrate processing by executing a recipe while managing a process status of a process job, a process status of a control job, a process status of a substrate storage container, a process status of a substrate, the process status of the substrate processing apparatus itself, etc. as described above.

(4) Operations Performed when an Error Occurs

First, a change in a process status of a process job will be described to explain operations performed when an error occurs in substrate processing during execution of a recipe.

Figure 6:
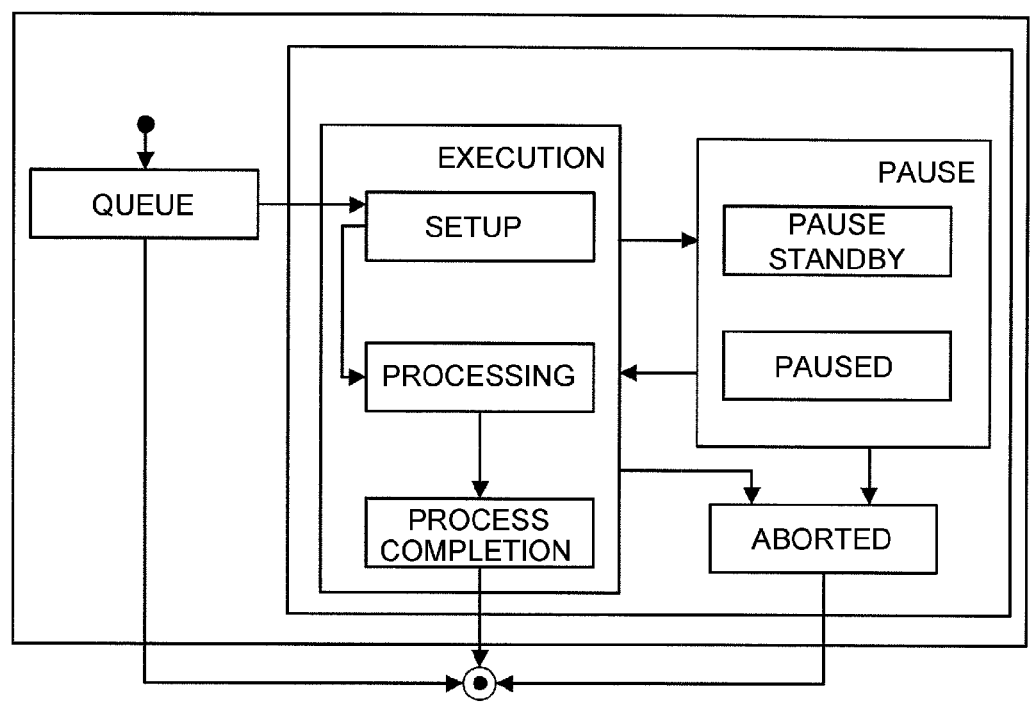
FIG. 6 is a diagram illustrating a change in a process status of a process job.

FIG. 6 is a diagram illustrating a change in a process status of a process job. In the present embodiment, the process status of the process job includes a queue state, an execution state (including a setup state, a processing state, and a process completion state), a pause state (including a pause standby state and a paused state), and an aborted state according to progress of the process job.

A change in the process status of the process job is controlled by the substrate processing apparatus, for example, as will be described below. The process job that is in the queue state changes to the setup state when a job execution order arrives, changes to the processing state when a processing preparation is completed, and changes to the process completion state when the process job is completed. The process job changes to the pause standby state and then to the paused state when the process job is to be temporarily stopped, and changes to the processing state when the process job is resumed. Also, the process job changes to the aborted state when the process job is discontinued regardless of whether the substrate processing is completed or not.

Figure 7:
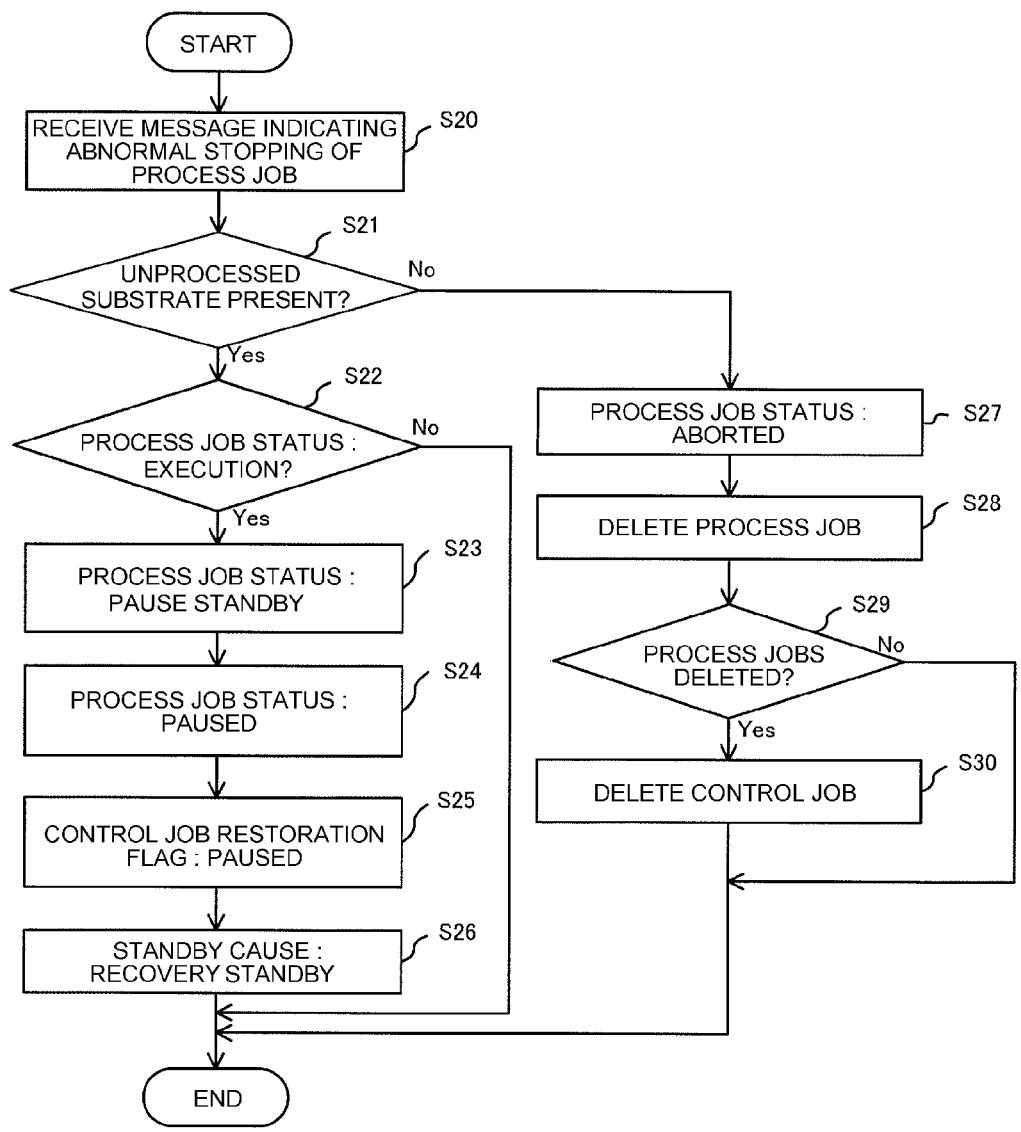
FIG. 7 is a flowchart of operations performed when an error occurs in substrate processing during execution of a recipe.

FIG. 7 is a flowchart of operations performed when an error occurs in substrate processing during execution of a recipe. Here, it is assumed that the identification (ID) number of a control job is "CJ000," the ID number of a process job associated with the control job is "PJ000," and the ID number of a FOUP that is a target of the substrate processing is "LP-CARRIER." The operations illustrated in FIG. 7 are performed by, for example, the manipulation unit 100, but may be performed by a control unit installed outside the substrate processing apparatus or the like.

The substrate processing apparatus stops the substrate processing when an error is detected during the substrate processing. In this case, a message indicating the abnormal stopping of the process job having the ID number "PJ000" is transmitted to the manipulation unit 100 from the integrated controller 90. Thus, the manipulation unit 100 receives the message indicating the abnormal stopping of the process job having the ID number "PJ000" (operation S20).

Then, it is determined whether an unprocessed substrate is present among substrates to be processed using the process job having the ID number "PJ000" (operation S21). Also, the substrates to be processed using the process job having the ID number "PJ000" and process statuses of the substrates are defined based on information regarding the process job, for example, as illustrated in FIG. 5.

When it is determined in operation S21 that an unprocessed substrate is present, it is determined whether a process status of the process job having the ID number "PJ000" is in the execution state (operation S22). When it is determined in operation S22 that the process status of the process job having the ID number "PJ000" is the execution state, the process status of the process job having the ID number "PJ000" is changed to the pause state (operations S23 and S24). Then, a flag indicating that the control job having the ID number "CJ000" is in the pause state is set (operation S25), and information indicating that the error that causes the substrate processing to be stopped is canceled is set (operation S26).

Also, if it is determined in operation S21 that an unprocessed substrate is not present, the process status of the process job having the ID number "PJ000" is changed to the aborted state (operation S27), and the process job having the ID number "PJ000" is deleted (operation S28). Then, it is determined whether all process jobs associated with the control job having the ID number "CJ000" are deleted (operation S29). If it is determined in operation S29 that all the associated process jobs are deleted, the control job having the ID number "CJ000" is deleted (operation S30).

Although a change in the process status of the process job has been described above, the substrate processing apparatus according to the present embodiment may operate by changing the process status the substrate processing apparatus as will be described below. Here, the process status of the substrate processing apparatus is changed by running a program, for example, using the manipulation unit 100, but may be changed by a control unit installed outside the substrate processing apparatus or the like.

The manipulation unit 100 changes the process status of the substrate processing apparatus from the idle state to the standby state when an operator presses, for example, a standby button (not shown) displayed on the display unit 115 of the display device 110, changes the process status to the ready state when a predetermined preparation is completed, and changes the process status from the ready state to the running state when a substrate storage container is loaded, a process job and a control job are generated, and process conditions are satisfied.

Also, when the process job and the control job are generated, the manipulation unit 100 changes the process statuses of the process job and the control job to the queue state. Also, when the process conditions are satisfied, the manipulation unit 100 changes the process status of the control job to the execution state and the process status of the process job to the setup state. When a first substrate that is to be processed according to the process job arrives at the process chamber PM1 or the process chamber PM2, the manipulation unit 100 changes the process status of the process job to the processing state and the process status of the first substrate to the processing state.

When an error occurs in the substrate processing during execution of a recipe, the manipulation unit 100 changes the process status of the substrate processing apparatus from the running state to the abnormal termination state.

(5) A Resume Operation Performed after the Error Occurs

When the error is canceled and an operation is performed to resume the execution of the recipe, the substrate processing apparatus resumes the execution of the recipe to process an unprocessed substrate by changing the process status of the process job (the process job having the ID number "PJ000" in the present embodiment) from the pause state to the processing state.

The operation performed to resume the execution of the recipe may include a task of collecting substrates remaining in the process chambers PM1 and PM2 of the substrate processing apparatus when a device is stopped due to the error. Here, the task of collecting the substrates may be automatically performed by the substrate processing apparatus or may be performed by an operator or the like. Also, the substrate processing apparatus according to the present embodiment operates as will be described below to perform the operation to resume the execution of the recipe (see FIG. 9).

Figure 8:
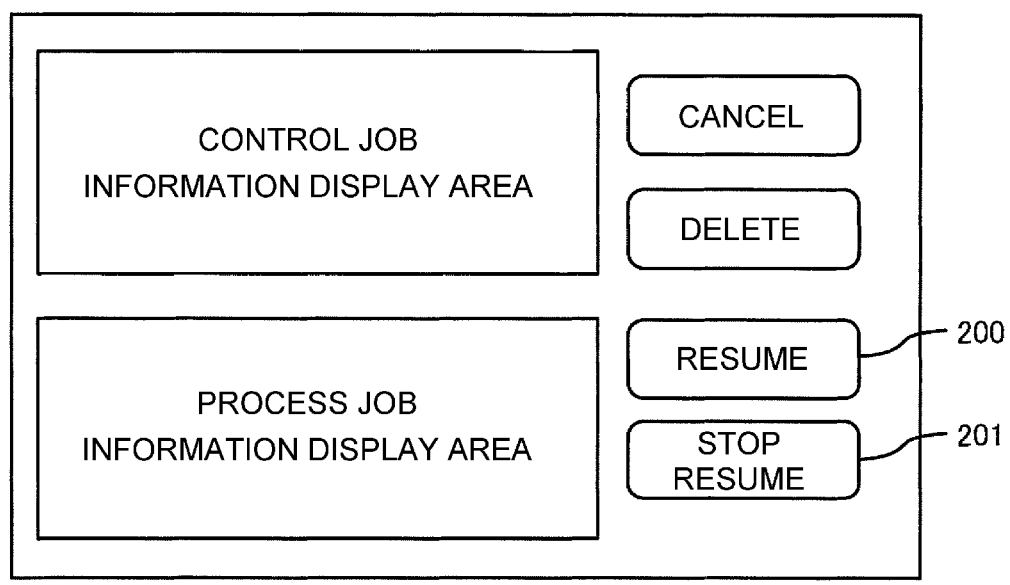
FIG. 8 is a plan view illustrating an example of an image displayed on a display unit of a display device.

When the error is canceled, the manipulation unit 100 displays a button 200 for receiving a command instructing to resume a stopped operation (hereinafter referred to as the "resume request button" 200) on the display unit 115 of the display device 110 as illustrated in FIG. 8. In the present embodiment, as illustrated in FIG. 8, a button 201 for receiving a command instructing not to resume a stopped operation (hereinafter referred to as the "resume stop button 201") is also displayed. When the resume request button 200 or the resume stop button 201 is pressed, the control unit receives a command given by pressing the button 200 or 201 and operates according to the given command. Also, a function of detecting whether an error occurring in the substrate processing apparatus is canceled may be installed, and the manipulation unit 100 may display the button 200 or 201 when the canceling of the error is detected.

Figure 9:
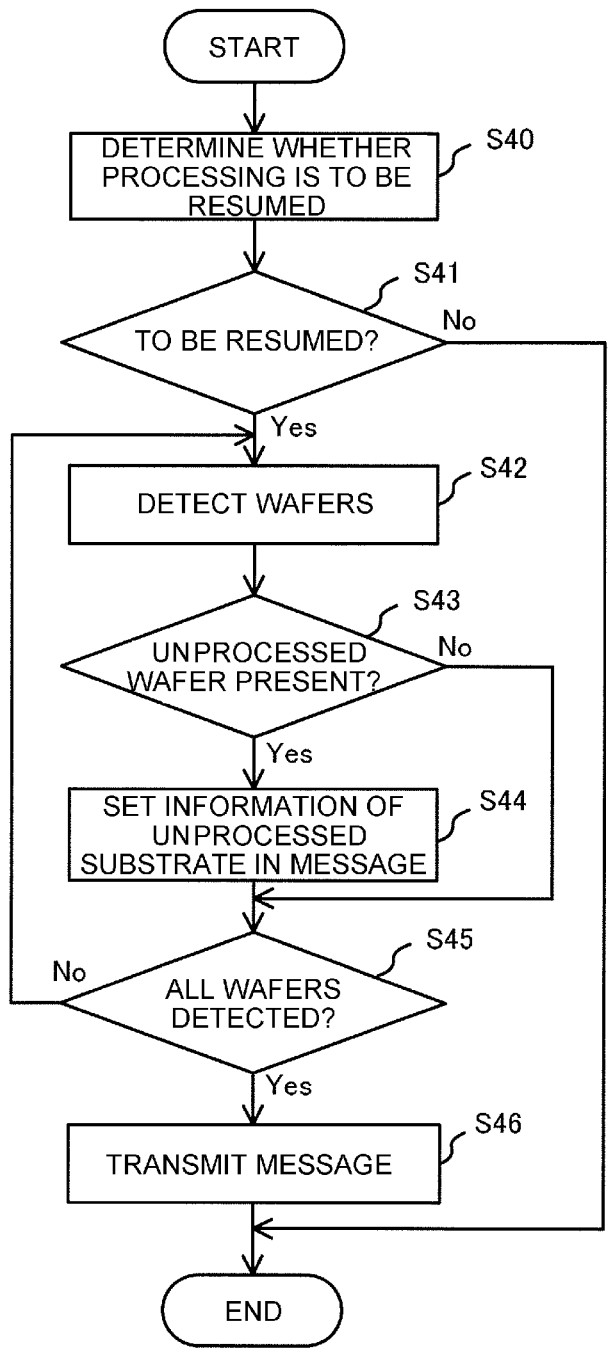
FIG. 9 is a flowchart illustrating an example of operations of a substrate processing apparatus when a resume request button is pressed.

FIG. 9 is a flowchart illustrating an example of operations of a substrate processing apparatus when an operator presses the resume request button 200. A series of operations illustrated in FIG. 9 are performed by running a program by, for example, the manipulation unit 100 but may be performed by a control unit installed outside the substrate processing apparatus. Also, in the present embodiment, after an error occurs, an operator presses an idle button (not shown) and a standby button (not shown) displayed on the display unit 115 before the resume request button 200 is pressed. In this case, the manipulation unit 100 changes the process status of the substrate processing apparatus from the abnormal termination state to the idle state when the idle button is pressed, changes the process status of the substrate processing apparatus from the idle state to the standby state when the standby button is pressed, and changes the process status of the substrate processing apparatus to the ready state when a predetermined preparation is completed.

When the manipulation unit 100 detects the pressing of the resume request button 200, the manipulation unit 100 changes the process status of the substrate processing apparatus from the ready state to the run (or running) state, and detects whether the processing is to be resumed (operation S40). Operation S40 will be described in detail below.

When it is determined that the substrate processing cannot be resumed ("no" in operation S41), the flow of the operations of the substrate processing apparatus is completed. In this case, the reason for which the substrate processing cannot be resumed may be displayed on the display unit 115.

When it is determined that the substrate processing is to be resumed ("yes" in operation S41), operations that will be described below are performed. First, substrates that are targets in a process job, the process status of which is in the pause state (the process job having the ID number "PJ000" in the above example) among process jobs associated with a control job for which a flag indicating the pause state is set (the control job having the ID number "CJ000" in the above example) are detected (operation S42). When an unprocessed substrate is detected during the detection, information identifying the unprocessed substrate (e.g., wafer ID) is set in a message (operation S44). Operations S42 to S44 are repeatedly performed if the detection of all the substrates that are targets in the process job having the ID number "PJ000" has not ended ("no" in operation S45). When the detection of all the substrates that are targets in the process job having the ID number "PJ000" ends ("yes" in operation S45), the manipulation unit 100 transmits the message to the integrated controller 90, instructs the unprocessed substrate set in the message to be processed, and changes the process status of the process job from the pause state to the processing state (operation S46). As such, the execution of the recipe is resumed to process the unprocessed substrate as described above.

Figure 10:
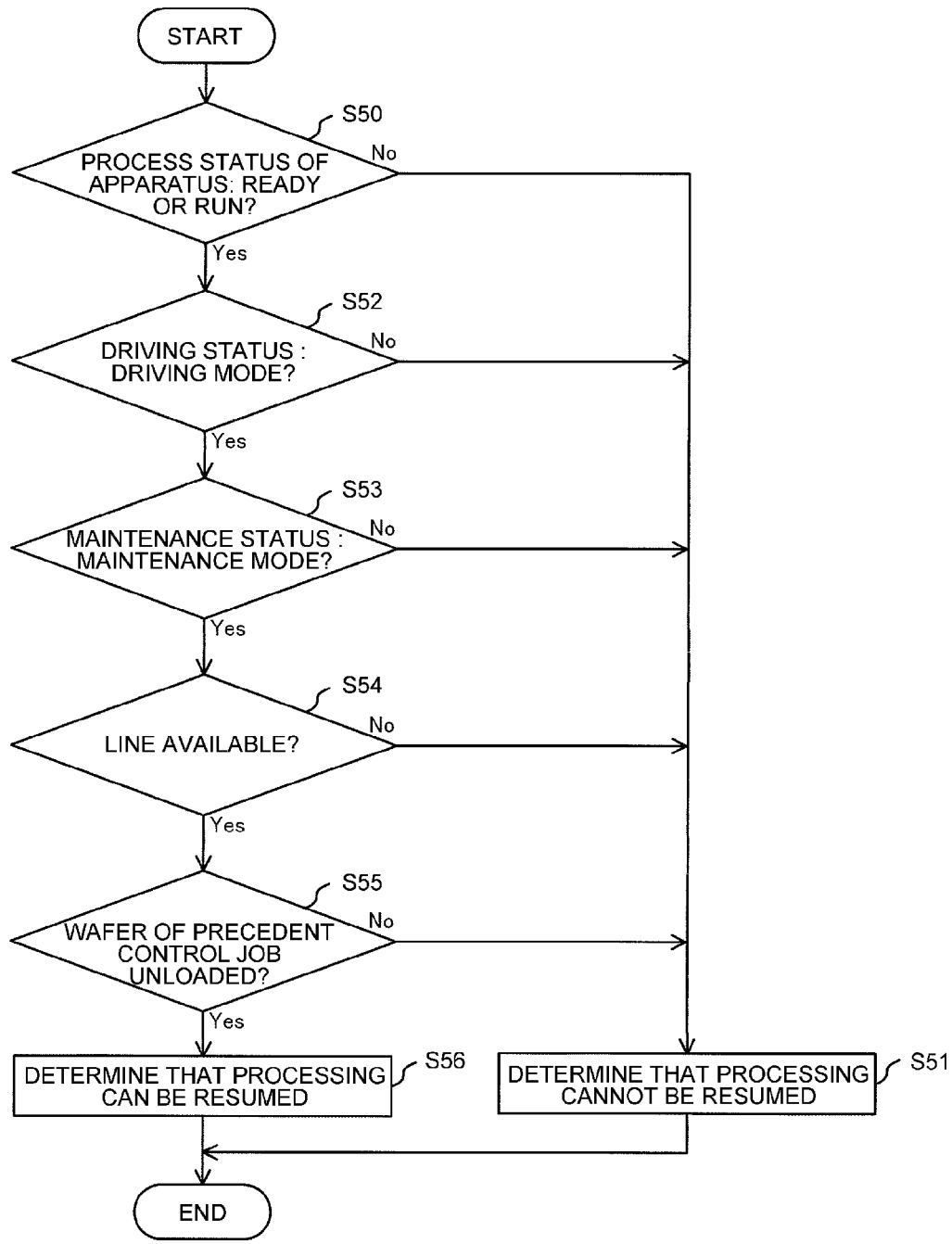
FIG. 10 is a flowchart illustrating an example of an operation of determining whether processing is to be resumed.

Next, operation S40 will be described in detail. FIG. 10 is a flowchart illustrating an example of an operation of determining whether processing is to be resumed.

First, the manipulation unit 100 checks whether a process status of the substrate processing apparatus is the ready state or the running state (operation S50), and determines that processing cannot be resumed when it is determined that the process status of the substrate processing apparatus is neither the ready state nor the running state ("no" in operation S50) (operation S51).

When it is determined that the process status of the substrate processing apparatus is either the ready state or the running state ("yes" in operation S50), the manipulation unit 100 checks whether a driving status is set in a driving mode (operation S52) and determines that processing cannot be resumed when the driving status is not set in the driving mode ("no" in operation S52) (operation S51).

When the driving status is set in the driving mode ("yes" in operation S52), the manipulation unit 100 checks whether a maintenance status is set in a maintenance mode (operation S53) and determines that processing cannot be resumed when the maintenance status is not set in the maintenance mode ("no" in operation S53) (operation S51).

When the maintenance status is set in the maintenance mode ("yes" in operation S53), the manipulation unit 100 checks whether a line such as the LAN line 80 is in an available state (operation S54) and determines that processing cannot be resumed when the line such as the LAN line 80 is not in the available state ("no" in operation S54) (operation S51).

When the line such as the LAN line 80 is in the available state ("yes" in operation S54), the manipulation unit 100 checks whether unloading of a finally processed substrate in a preceding control job is completed (operation S55). The manipulation unit 100 determines that processing cannot be resumed when the unloading of the finally processed substrate is not completed ("no" in operation S54) (operation S51), and determines that processing can be resumed when the unloading of the finally processed substrate is completed ("yes" in operation S54) (operation S56). To determine whether substrate processing can be resumed, it may be determined whether an error is canceled and whether substrates remaining when an error occurs are collected.

Operations performed when the resume request button 200 is pressed have been described above. When the resume stop button 201 is pressed by an operator, the manipulation unit 100 changes a process status of a process job that is in the pause state (the process job having the ID number "PJ000" in the above example) to the aborted state among process jobs associated with a control job for which a flag indicating the pause state is set (the control job having the ID number "CJ000" in the above example), and deletes the process job and the control job. Also, a process status of a substrate storage container (LP-carrier in the above example) that is to be processed according to the control job is in the abnormal termination state. Also, the execution of a recipe may be ended by changing the process status of the process job that is in the pause state to the aborted state when an error occurs, regardless of whether the resume stop button 201 is pressed.

In the substrate processing apparatus according to the present embodiment described above, the process job and the control job are not in the aborted state and are not deleted even when an error occurs during substrate processing. Thus, a process status of a substrate storage container that is to be processed in the control job is not in the aborted state and the substrate storage container need not be reloaded in the substrate processing apparatus when the substrate processing is resumed. Since the process job and the control job are not deleted and the substrate storage container need not be reloaded, data regarding process statuses of substrates before an error occurs may be continuously used, thereby enabling unprocessed substrates to be sorted out. Accordingly, an operator need not input information regarding substrates that are not processed during occurrence of an error when substrate processing is resumed, thereby decreasing input mistakes from the operator and man-hours. As described above, in the substrate processing apparatus according to the present embodiment, data regarding substrates may be managed while maintaining the integrity of the data between a time before an error during substrate processing and the time at which the substrate processing is resumed. Accordingly, processing of substrates that are not processed after an error occurs may be efficiently resumed.

Another Embodiment of the Present Invention

Another embodiment of the present invention will now be described. A control job, a process job, an operation performed when an error occurs, and a resume operation performed after the error occurs according to the present embodiment are substantially the same as in the previous embodiment and will thus not be redundantly described here.

Figure 11:
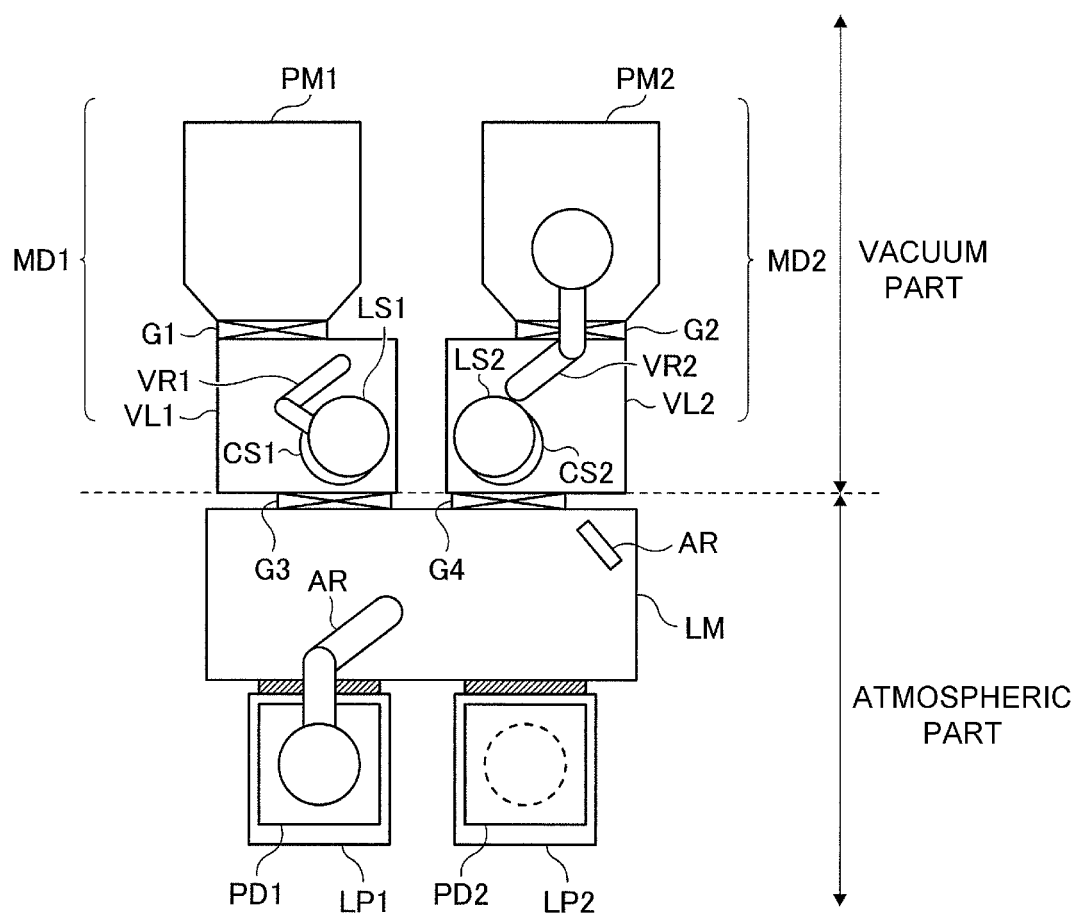
FIG. 11 is a diagram schematically illustrating an in-line type substrate processing apparatus according to another embodiment of the present invention.

The structure of a substrate processing apparatus according to another embodiment is illustrated in FIG. 11. FIG. 11 is a diagram schematically illustrating an in-line type substrate processing apparatus according to another embodiment of the present invention. The in-line type substrate processing apparatus also is divided into a vacuum part and an atmospheric part.

Structure of the Vacuum Part

In the vacuum part of the in-line type substrate processing apparatus, two substrate processing modules MD1 and MD2 are installed in parallel. The substrate processing module MD1 includes a process chamber PM1 serving as a process furnace including a process chamber configured to process a wafer W which is a substrate, and a vacuum lock chamber VL1 that is a spare chamber installed at a front end of the process chamber PM1. The substrate processing module MD2 includes a process chamber PM2 and a vacuum lock chamber VL2, similar to the substrate processing module MD1.

The process chambers PM1 and PM2 are configured to add an added value to the wafer W by performing a process of forming a thin film on the wafer W, a process of forming an oxide film or a nitride film on a surface of the wafer W, or a process of forming a metal thin film on the wafer W, as in the cluster type substrate processing apparatus. In each of the process chambers PM1 and PM2, a gas introduction/exhaust mechanism (not shown), a temperature control/plasma discharge mechanism (not shown), an MFC 11 configured to control the flow rate of a process gas to be supplied into the process chamber, an APC 12 configured to control pressure in the process chamber, a temperature adjustor 13 configured to control a temperature in the process chamber, and an input/output valve I/O 14 configured to control supply of a process gas or control an exhaust valve to be "on"/"off," etc. Each of the process chambers PM1 and PM2 is configured to process a surface of the wafer W by supplying a process gas into the process chamber using the gas introduction mechanism while exhausting the inside of the process chamber using the gas exhaust mechanism, and generating plasma in the process chamber by supplying high-frequency power to the plasma discharge mechanism.

The vacuum lock chambers VL1 and VL2 serve as spare chambers for loading the wafer W into or unloading the wafer W from the process chambers PM1 and PM2, respectively.

Vacuum robots VR1 and VR2 are installed as vacuum transfer mechanisms in the vacuum lock chambers VL1 and VL2, respectively. The vacuum robot VR1 may transfer the wafer W between the process chamber PM1 and the vacuum lock chamber VL1, and the vacuum robot VR2 may transfer the wafer W between the process chamber PM2 and the vacuum lock chamber VL2. Also, an arm is installed as a substrate placing unit in each of the vacuum robots VR1 and VR2.

Also, a multi-step stage, e.g., a vertical two-step stage, which is capable of retaining the wafer W is installed in each of the vacuum lock chambers VL1 and VL2. The wafer W is retained in upper buffer stages LS1 and LS2, and a mechanism for cooling the wafer W is installed in each of lower cooling stages CS1 and CS2.

The vacuum lock chamber VL1 communicates with the process chamber PM1 via a gate valve G1, and the vacuum lock chamber VL2 communicates with the process chamber PM2 via a gate valve G2. Also, the vacuum lock chambers VL1 and VL2 communicate with an atmospheric transfer chamber LM which will be described below via gate valves G3 and G4, respectively. Thus, the wafer W may be transferred between the vacuum lock chamber VL1 and the process chamber PM1 and between the vacuum lock chamber VL2 and the process chamber PM2 while the insides of the process chambers PM1 and PM2 are maintained in a vacuum-airtight state by opening the gate valves G1 and G2 while the gate valves G3 and G4 are closed.

Also, the vacuum lock chambers VL1 and VL2 may be configured to have load lock chamber structures capable of withstanding a negative pressure that is less than atmospheric pressure, e.g., a vacuum state, and the insides of the vacuum lock chambers VL1 and VL2 may be vacuum-exhausted. Thus, the wafer W may be transferred between the vacuum lock chambers VL1 and VL2 and the atmospheric transfer chamber LM while the insides of the process chambers PM1 and PM2 are maintained in a vacuum-airtight state by supplying clean air into the vacuum lock chambers VL1 and VL2 by closing the gate valves G3 and G4 and then opening the gate valves G3 and G4.

Structure of the Atmospheric Part

In the atmospheric part of the in-line type substrate processing apparatus, the atmospheric transfer chamber LM connected to the vacuum lock chambers VL1 and VL2 is installed as an atmospheric transfer chamber, and load ports LP1 and LP2 are installed as substrate storage units to place substrate storage containers (hereinafter referred to as pods PD1 and PD2) connected to the atmospheric transfer chamber LM thereon, as described above.

An atmospheric robot AR is installed in the atmospheric transfer chamber LM, and may transfer the wafer W between the vacuum lock chamber VL1 and the load port LP1 and between the vacuum lock chamber VL2 and the load port LP2. Also, an arm is installed as a substrate placing unit in the atmospheric robot AR.

Also, in the atmospheric transfer chamber LM, an aligner unit AU may be installed as a substrate position adjustment device to correct misalignment of wafers W when the wafers W are transferred and to perform notch adjustment to adjust the notches of the wafers W in a certain direction.

The pods PD1 and PD2 configured to store a plurality of wafers W thereon may be placed in the load ports LP1 and LP2.

Although a semiconductor manufacturing apparatus is exemplified as an example of the substrate processing apparatus in the present disclosure, the substrate processing apparatus is not limited to the semiconductor manufacturing apparatus and may be an apparatus capable of processing a glass substrate, e.g., a liquid crystal display (LCD) apparatus. Also, the substrate processing is not limited to a film forming process. Examples of the film forming process include chemical vapor deposition (CVD), physical vapor deposition (PVD), a process of forming an oxide film or a nitride film, a process of forming a film including a metal, etc. Otherwise, the substrate processing apparatus may be a different type substrate processing apparatus, e.g., an exposure apparatus, a lithography apparatus, a coating apparatus, or a CVD apparatus using plasma.

Also, a manipulation unit according to an embodiment of the present invention may be embodied using a general-purpose computer system rather than a dedicated system. For example, the manipulation unit capable of performing the processes described above may be configured by installing programs for performing the processes described above from a memory medium storing the programs (e.g., a flexible disk, a compact disc-read only memory (CD-ROM), a Universal Serial Bus (USB), etc.) into a general-purpose computer.

Means for supplying the programs may be arbitrarily chosen. As described above, the programs may be supplied via a certain recording medium or via, for example, a communication line, a communication network, a communication system, etc. In this case, the programs may be published on, for example, a bulletin board of a communication network and provided by overlapping the programs with a carrier wave via the network. The processes described above may be performed by starting up and running the provided programs similarly to other application programs, under control of an operating system (OS).

While various embodiments of the present invention have been described in detail above, the present invention is not limited thereto and may be embodied in different forms without departing from the spirit and scope of the invention as defined by the appended claims.

The present invention is defined in the appended claims but the following supplementary notes are added herein as exemplary embodiments of the present invention.

Supplementary Note 1

According to one aspect of the present invention, there is provided a substrate processing apparatus including a control unit configured to control execution of a recipe that defines an order of processing substrates and manage process statuses of the substrates, and a manipulation unit configured to receive a command instructing to resume a stopped operation. The control unit changes the process statuses to a processing state to control the substrates to be processed according to the recipe, changes the process statuses to an aborted state when unprocessed substrates are not present among the substrates to be processed according to the recipe when the processing of the substrates according to the recipe is stopped due to an error occurring during the processing of the substrates according to the recipe, changes the process statuses to a pause state when unprocessed substrates are present among the substrates to be processed according to the recipe, changes the process statuses from the pause state to the processing state when the manipulation unit receives a command instructing to resume the stopped processing of the substrates after the process statuses change to the pause state, and changes the process statuses from the pause state to the aborted state when the manipulation unit receives a command instructing not to resume the stopped processing of the substrates after the process statuses change to the pause state.

Supplementary Note 2

According to another aspect of the present invention, there is provided a method of handling an error occurring in a substrate processing apparatus that executes a recipe defining an order of processing substrates and manages process statuses of the substrates, the method including changing the process statuses to a processing state to process the substrates according to the recipe, changing the process statuses to an aborted state when unprocessed substrates are not present among the substrates to be processed according to the recipe when the processing of the substrates according to the recipe is stopped due to an error occurring during the processing of the substrates according to the recipe, changing the process statuses to a pause state when unprocessed substrates are present among the substrates to be processed according to the recipe, changing the process statuses from the pause state to the processing state when a command instructing to resume the stopped processing of the substrates is received after the process statuses change to the pause state, and changing the process statuses from the pause state to the aborted state when a command instructing not to resume the stopped processing of the substrates is received after the process statuses change to the pause state.

Supplementary Note 3

According to another aspect of the present invention, there is provided a non-transitory computer-readable recording medium storing a program for causing a computer of a substrate processing apparatus to perform a control sequence for controlling execution of a recipe defining an order of processing substrates and managing process statuses of the substrates, the control sequence including (a) a sequence of changing the process statuses to a processing state so as to process the substrates according to the recipe; (b) a sequence of changing the process statuses to an aborted state to discontinue the execution of the recipe when unprocessed substrates are not present among the substrates to be processed according to the recipe when the processing of the substrates according to the recipe is stopped due to an error occurring during the execution of the recipe; and (c) a sequence of changing the process statuses to a pause state when unprocessed substrates are present among the substrates to be processed according to the recipe when the processing of the substrates according to the recipe is stopped due to an error occurring during the execution of the recipe.

Supplementary Note 4

In the non-transitory computer-readable recording medium of supplementary note 3, the control sequence further includes (d) a sequence of changing the process statuses from the pause state to the processing state when a command instructing to resume the stopped processing of the substrates is received, and controlling the execution of the recipe to be resumed to process the unprocessed substrates.

Supplementary Note 5

According to another aspect of the present invention, there is provided a control program for causing a computer of a substrate processing apparatus to control execution of a recipe defining an order of processing substrates and manage process statuses of the substrates, the control program including a step of changing the process statuses to a processing state to process the substrates according to the recipe, a step of changing the process statuses to an aborted state when unprocessed substrates are not present among the substrates to be processed according to the recipe when the processing of the substrates according to the recipe is stopped due to an error occurring during the execution of the recipe, and a step of changing the process statuses to a pause state when unprocessed substrates are present among the substrates to be processed according to the recipe.

Supplementary Note 6

The control program of supplementary note 5, further including a step of changing the process statuses from the pause state to the processing state when a command instructing to resume the stopped processing of the substrates is received after the process statuses change to the pause state, and a step of changing the process statuses from the pause state to the aborted state when a command instructing not to resume the stopped processing of the substrates is received after the process statuses change to the pause state.

Supplementary Note 7

According to another aspect of the present invention, there is provided a non-transitory computer-readable recording medium storing a control program for causing a computer of a substrate processing apparatus to control execution of a recipe defining an order of processing substrates and manage process statuses of the substrates, the control program including a step of changing the process statuses to a processing state so as to process the substrates according to the recipe, a step of changing the process statuses to an aborted state when unprocessed substrates are not present among the substrates to be processed according to the recipe when the processing of the substrates according to the recipe is stopped due to an error occurring during the processing of the substrates according to the recipe, and a step of changing the process statuses to a pause state when unprocessed substrates are present among the substrates to be processed according to the recipe.

Supplementary Note 8

According to another aspect of the present invention, there is provided a method of manufacturing a semiconductor device that executes a recipe defining an order of processing substrates and manages a status of a substrate processing apparatus, the method including changing the status of the substrate processing apparatus to a running state indicating an execution state of the recipe so as to perform processing according to the recipe, changing the status of the substrate processing apparatus from the running state to an abnormal termination state when an error occurs during the processing according to the recipe, changing the status of the substrate processing apparatus from the abnormal termination state to an idle state when a predetermined command is received, and changing the status of the substrate processing apparatus from the idle state to a ready state and finally to the running state so as to resume the processing according to the recipe when the error is canceled and a recovery operation is performed to resume the processing according to the recipe.

Supplementary Note 9

According to another aspect of the present invention, there is provided a substrate processing apparatus including a control unit configured to control execution of a recipe defining an order of processing substrates and manages a process status of the substrate processing apparatus, and a manipulation unit configured to receive a command. The control unit changes the process status from a running state to an abnormal termination state when an error occurs during the execution of the recipe. The manipulation unit transmits a command instructing to change the process status to the control unit when a predetermined command is received. The control unit changes the process status from the abnormal termination state to an idle state when the control unit receives the command instructing to change the process status from the manipulation unit. The control unit changes the process status from the idle state to a ready state and finally to the running state so as to resume the execution of the recipe when the error is canceled and a recovery operation is performed to resume the execution of the recipe.

Supplementary Note 10

According to another aspect of the present invention, there is provided a control program for executing a computer of a substrate processing apparatus to control execution of a recipe defining an order of processing substrates and manage a status of the substrate processing apparatus, the control program including changing the status of the substrate processing apparatus from a running state to an abnormal termination state when an error occurs during the execution of the recipe, changing the status of the substrate processing apparatus from the abnormal termination state to an idle state when a predetermined command is received, and changing the status of the substrate processing apparatus from the idle state to a ready state and finally to the running state so as to resume the execution of the recipe when the error is canceled and a recovery operation is performed to resume the execution of the recipe.

Supplementary Note 11

According to another aspect of the present invention, there is provided a non-transitory computer-readable recording medium storing a control program for causing a computer of a substrate processing apparatus to control execution of a recipe defining an order of processing substrates and manage a process status of the substrate processing apparatus, the control program including (a) a sequence of changing the process status from a running state to an abnormal termination state when an error occurs during the execution of the recipe, (b) a sequence of changing the process status from the abnormal termination state to an idle state when a predetermined command is received; and (c) a sequence of changing the process status from the idle state to a ready state and finally to the running state so as to resume the execution of the recipe when the error is canceled and a recovery operation is performed to resume the execution of the recipe.

Supplementary Note 12

According to another aspect of the present invention, there is provided a substrate processing method of managing a status of a substrate processing apparatus and process statuses of substrates, the substrate processing method including changing the status of the substrate processing apparatus to a running state; and loading the substrates into a process chamber and changing the process statuses of the substrates to a running state so as to execute a recipe defining an order of processing the substrates.

Supplementary Note 13

In the substrate processing method of supplementary note 12, substrate statuses of the respective substrates are managed and changed to a processing state so as to execute the recipe.

Supplementary Note 14

In the substrate processing method of supplementary note 12 or 13, a first process status indicating a process status of the recipe (status of a process job) and at least one second process status indicating a process status of each of at least one recipe associated with the process status of the recipe (status of a control job) are managed as process statuses, and the status of the substrate processing apparatus is managed in association with the at least one second process status.

Supplementary Note 15

In the substrate processing method of supplementary note 14, the first process status and at least one of the process statuses of the substrates are managed in association with each other.

Supplementary Note 16

In the substrate processing apparatus of supplementary note 1 or 9, a plurality of substrate processing modules including an atmospheric transfer chamber and a front chambers which are vacuum-sealable substrate processing modules connected in parallel to one side of the atmospheric transfer chamber and communicate with the side of the atmospheric transfer chamber, and a substrate processing chamber communicating with the front chambers; a substrate storage unit connected to another side of the atmospheric transfer chamber and configured to retain a substrate storage container for accommodating substrates; a first substrate transfer device included in the atmospheric transfer chamber and configured to transfer substrates to the substrate processing module or the substrate storage unit via the atmospheric transfer chamber; second substrate transfer devices included in the front chambers that constitute the substrate processing modules, respectively, and configured to transfer substrates between the front chambers and the substrate processing chamber; and a control unit configured to control pressure in the first substrate transfer device, the second substrate transfer devices, and the front chambers are further included.

Supplementary Note 17

The substrate processing apparatus of supplementary note 1 or 9 is a cluster type single-wafer device including a first transfer chamber including a plurality of process chambers for processing substrates and a first transfer unit for transferring the plurality of substrates to the plurality of process chambers, and connected to the plurality of process chambers; a second transfer chamber including a second transfer unit for transferring the plurality of substrates in an atmospheric pressure state; a spare chamber, the atmosphere of which is variable (in which pressure is reducible) and that connects the first transfer chamber and the second transfer chamber; and a control unit configured to control the transfer of the plurality of substrates between a substrate storage unit accommodating the plurality of substrates and the plurality of process chambers using the first transfer unit and the second transfer unit.

What is claimed is:

1. A substrate processing apparatus comprising:
a manipulation unit configured to: control an execution of a process recipe defining an order of processing a substrate; and receive a resume command instructing to resume a stopped process recipe while managing a process status of the substrate and a status of the substrate processing apparatus; and
a controller configured to control an operation of a process chamber providing an added value to the substrate by processing a surface thereof;
wherein the manipulation unit is configured to: change the status of the substrate processing apparatus to running state and the process status of the substrate to a processing state such that the controller executes the process recipe; change the status of the substrate processing apparatus to abnormal termination state when an execution of the process recipe by the controller is stopped due to an error occurring during the execution of the process recipe; determine whether the execution of the process recipe be resumed upon receiving the resume command after the error is canceled; change the process status of the substrate from pause state to aborted state when the execution of the process recipe is determined to be not resumable such that the controller ends the execution of the process recipe; change the process status of the unprocessed substrate from pause state to processing state when the execution of the process recipe is determined to be not resumable such that the execution of the process recipe is resumed by the controller; and change the process status of the substrate from the pause state to an aborted state and terminate the execution of the process recipe upon receiving a command instructing to abort the stopped process recipe, and
the manipulation unit is further configured to, when determining whether the execution of the process recipe be resumed: check whether the process status of the substrate processing apparatus is ready state or the running state; check whether the process status of the substrate processing apparatus is running state; check whether a maintenance status of the substrate processing apparatus is maintenance mode; check whether a communication line is available; and check whether the substrate is unloaded from the substrate processing apparatus.

2. The substrate processing apparatus of claim 1, wherein the process status of the substrate is associated with a process status of a process job generated for each process recipe.

3. The substrate processing apparatus of claim 2, wherein a control job associated with at least one of the process job generated for each process recipe comprises information regarding synthetically controlling each substrate process.

4. The substrate processing apparatus of claim 3, wherein the control job is associated with source carrier information defining a substrate storage container accommodating substrates to be processed, target carrier information defining a substrate storage container accommodating processed substrates and information regarding a process status of the control job.

5. The substrate processing apparatus of claim 4, wherein the process status of the control job comprises a queue state, an execution state and a process completion state.

6. The substrate processing apparatus of claim 2, wherein the recipe comprises a process recipe defining the order of processing the substrate, and the process job is generated for each process recipe and comprises information for controlling a substrate processing.

7. The substrate processing apparatus of claim 3, wherein a process status of a substrate storage container is associated with the control job.

8. The substrate processing apparatus of claim 2, wherein the process job is associated with information about material in use of substrates to be processed, information about the process recipe used for each substrate process, a process status information about the process job and a variable parameter information.

9. The substrate processing apparatus of claim 8, wherein the process status of the process job is selected from a queue state, a setup state, a processing state, a process completion state, a pause standby state, a pause state and an aborted state.

10. The substrate processing apparatus of claim 1, wherein the manipulation unit comprises: a first button for changing the status of the substrate processing apparatus to idle state; a second button for changing the status of the substrate processing apparatus to standby state; and a third button for resuming stopped process, and the manipulation unit is further configured to detect pressing of the first button and the second button before the third button is pressed.

11. The substrate processing apparatus of claim 10, wherein the manipulation unit is further configured to change the status of the substrate processing apparatus to idle state from abnormal termination state when the first button is pressed, and change the status of the substrate processing apparatus to standby state from idle state when the second button is pressed.

\* \* \* \* \*